(12) United States Patent
Kohout

(10) Patent No.: US 10,651,665 B2
(45) Date of Patent: May 12, 2020

(54) CURRENT SENSE APPARATUS FOR BATTERY CHARGER SYSTEMS

(71) Applicant: Active-Semi (BVI) Inc., Allen, TX (US)

(72) Inventor: James Allen Kohout, Dallas, TX (US)

(73) Assignee: Active-Semi (BVI), Inc., Allen, TX (US)

( * ) Notice: Subject to any disclaimer, the term of this patent is extended or adjusted under 35 U.S.C. 154(b) by 49 days.

(21) Appl. No.: 15/819,005

(22) Filed: Nov. 21, 2017

(65) Prior Publication Data

US 2018/0076643 A1    Mar. 15, 2018

Related U.S. Application Data

(62) Division of application No. 14/842,497, filed on Sep. 1, 2015, now Pat. No. 9,859,733.

(51) Int. Cl.
*H02J 7/00*    (2006.01)

(52) U.S. Cl.
CPC .......... *H02J 7/0052* (2013.01); *H02J 7/0072* (2013.01)

(58) Field of Classification Search
USPC ........................................................ 320/164
See application file for complete search history.

(56) References Cited

U.S. PATENT DOCUMENTS

| | | | |
|---|---|---|---|
| 2004/0212347 A1* | 10/2004 | Fogg | H02J 7/0047 320/127 |
| 2005/0275381 A1 | 12/2005 | Guang et al. | |
| 2013/0043877 A1* | 2/2013 | Tang | H03F 1/0211 324/434 |
| 2013/0093238 A1 | 4/2013 | Gao et al. | |
| 2014/0347078 A1* | 11/2014 | Qin | G01R 19/0092 324/713 |
| 2015/0309524 A1* | 10/2015 | Levhar | G05F 3/02 327/540 |
| 2016/0268837 A1 | 9/2016 | Yang | |
| 2017/0063118 A1* | 3/2017 | Kohout | H02J 7/0052 |

* cited by examiner

*Primary Examiner* — Mohammed Alam
(74) *Attorney, Agent, or Firm* — Withrow & Terranova, P.L.L.C.

(57) ABSTRACT

A current sense method comprises generating a voltage across a first current mirror of a current sense apparatus, the voltage being proportional to a current flowing through the current sense apparatus when the current is greater than a predetermined current value and applying a minimum drain-to-source voltage limiter to the first current mirror of the current sense apparatus when the current is less than the predetermined current value, wherein, as a result of applying the minimum drain-to-source voltage limiter to the first current mirror, the voltage across the first current mirror is clamped to a predetermined voltage value.

20 Claims, 6 Drawing Sheets

CURRENT SENSE APPARATUS FOR BATTERY CHARGER SYSTEMS

CROSS-REFERENCE TO RELATED APPLICATIONS

This application is a divisional of U.S. application Ser. No. 14/842,497, filed on Sep. 1, 2015, entitled "Current Sense Apparatus for Battery Charger Systems", which application is hereby incorporated herein by reference.

TECHNICAL FIELD

The present invention relates to a current sense apparatus, and, in particular embodiments, to a current sense apparatus for a battery charger system.

BACKGROUND

As technologies further advance, a variety of battery powered portable devices, such as mobile phones, tablet PCs, digital cameras, MP3 players and/or the like, have become popular. Each portable device may employ a plurality of rechargeable battery cells. The plurality of rechargeable battery cells may be connected in series or in parallel so as to form a rechargeable battery pack for storing electrical energy.

According to different combinations of electrode materials and electrolytes used in rechargeable batteries, rechargeable batteries may be divided into a variety of categories. The most common rechargeable batteries include nickel-cadmium (NiCd) batteries, nickel-metal hydride (NiMH) batteries, lithium-ion batteries, lithium-ion polymer batteries, lithium-air batteries, lithium iron phosphate batteries and the like.

As power consumption has become more important, there may be a need for accurately monitoring the charge and discharge currents flowing through a rechargeable battery so as to achieve fast, safe and complete charging of the rechargeable battery. Current mirror based battery monitoring devices have become the preferred choice for achieving high performance (e.g., accurate current measurement information) because current mirrors are capable of generating a replica proportional to the current flowing through the rechargeable battery. However, as the current flowing through the rechargeable battery goes lower, the accuracy of the current mirror has become a significant issue, which presents challenges to designers of battery charger systems.

SUMMARY OF THE INVENTION

These and other problems are generally solved or circumvented, and technical advantages are generally achieved, by preferred embodiments of the present invention which in some embodiments may improve the accuracy of a battery charger system.

In accordance with an embodiment, a method comprises in a current sense mode, applying a minimum drain-to-source voltage limiter to a first current mirror of a current sense apparatus, wherein, as a result of applying the minimum drain-to-source voltage limiter to the first current mirror, a voltage across the first current mirror is clamped to a predetermined value, and in a power saving mode, disabling the minimum drain-to-source voltage limiter.

In accordance with another embodiment, a method comprises generating a voltage across a first current mirror of a current sense apparatus, the voltage being proportional to a current flowing through the current sense apparatus when the current is greater than a predetermined current value and applying a minimum drain-to-source voltage limiter to the first current mirror of the current sense apparatus when the current is less than the predetermined current value, wherein, as a result of applying the minimum drain-to-source voltage limiter to the first current mirror, the voltage across the first current mirror is clamped to a predetermined voltage value.

In accordance with yet another embodiment, a method comprises passing a current from a power source to a load through a first switch, mirroring in a second switch the current passing through the first switch, wherein the second switch comprises a gate connected to a gate of the first switch and a first terminal connected to a first terminal of the first switch, driving a voltage at a second terminal of the first switch equal to a voltage at a second terminal of the second switch through a first operational amplifier and maintaining a minimum voltage across the first switch through a second operational amplifier having an output connected to the gate of the first switch, a first input coupled to the first terminal of the first switch and a second input coupled to the second terminal of the first switch.

The method further comprises enabling a reference voltage source connected to one input of the second operational amplifier so that a voltage across the first switch is approximately equal to an output voltage of the reference voltage source during a current sense operation and disabling the reference voltage source so that the voltage across the first switch is equal to the current flowing through the first switch times an on-resistance value of the first switch during a power saving operation.

An advantage of a preferred embodiment of the present invention is improving a battery charger system's performance through injecting a minimum drain-to-source voltage into the battery charger system when the current flowing through a battery is below a predetermined threshold.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a current sense apparatus for a battery charger system. The invention may also be applied, however, to a variety of systems requiring accurate current sensing such as overcurrent protection, LED control, base station power supply control, motor drive control and the like. Hereinafter, various embodiments will be explained in detail with reference to the accompanying drawings.

Figure 1:
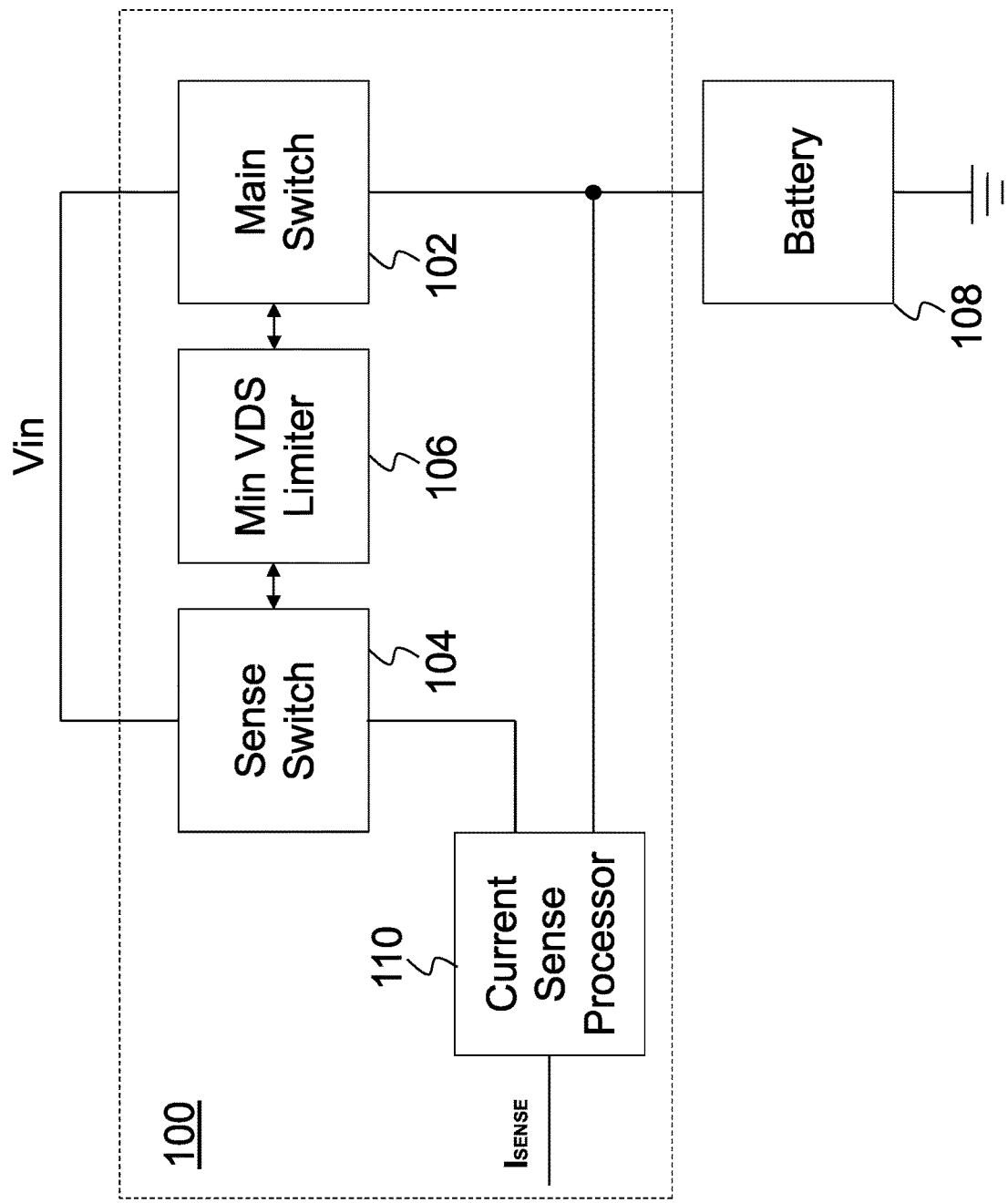
FIG. 1 illustrates a block diagram of a battery charger system in accordance with various embodiments of the present disclosure.

FIG. 1 illustrates a block diagram of a battery charger system in accordance with various embodiments of the present disclosure. The battery charger system 100 is coupled between a power source Vin and a battery 108. The power source Vin may be a power adapter converting a utility line voltage to a dc voltage. Alternatively, the power source Vin may be a renewable power source such as a solar panel array. Furthermore, the power source Vin may be an energy storage device such as rechargeable batteries, fuel cells and/or the like.

The battery 108 may be a nickel-cadmium (NiCd) battery, a nickel-metal hydride (NiMH) battery, a lithium-ion battery, a lithium-ion polymer battery, a lithium-air battery, a lithium iron phosphate battery and the like. In some embodiments, the battery 108 may comprise a single cell. In alternative embodiments, the battery 108 may comprise a plurality of rechargeable battery cells connected either in series or in parallel.

It should be noted that while FIG. 1 illustrates a battery charger system, one having ordinary skill in the art will recognize, the battery charger system in FIG. 1 is merely an example and is not meant to limit the current embodiments. The current sensing apparatus described in FIG. 1 can be used in other systems requiring accurate current sensing, such as such as overcurrent protection, LED control, base station power supply control, motor drive control and the like. All systems described above are fully intended to be included within the scope of the embodiments discussed herein.

The battery charger system 100 comprises a main switch 102, a sense switch 104, a minimum drain-to-source voltage (VDS) limiter 106 and a current sense processor 110. The main switch 102 is connected between the power source Vin and the battery 108. In some embodiments, the main switch 102 provides a conductive path for charging the battery 108. In some embodiments, the main switch 102 and the sense switch 104 may be implemented as N-type metal oxide semiconductor (NMOS) transistors. In alternative embodiments, the main switch 102 and the sense switch 104 may be implemented as P-type metal oxide semiconductor (PMOS) transistors.

In some embodiments, the current flowing through the main switch 102 is equal to the current flowing through the battery 108. As a result, the current flowing through the battery 108 can be measured by monitoring the current flowing through the main switch 102. The sense switch 104 is employed to generate accurate current measurement information based upon the current flowing through the main switch 102.

According to some embodiments, both the main switch 102 and the sense switch 104 are implemented as metal oxide semiconductor field effect transistor (MOSFET) or MOSFETs connected in parallel. Furthermore, the main switch 102 and the sense switch 104 may be formed by other types of controllable devices such as bipolar junction transistor (BJT) devices, super junction transistor (SJT) devices, insulated gate bipolar transistor (IGBT) devices, gallium nitride (GaN) based power devices and/or the like.

The minimum VDS limiter 106 is employed to inject a minimum voltage into the voltage across the main switch 102 so that the voltage across the main switch 102 is equal to or greater than the minimum voltage generated by the minimum VDS limiter 106.

One advantageous feature of having the minimum VDS limiter 106 is that the minimum voltage helps to improve the current sense accuracy when the current flowing through the main switch 102 is relatively low. The detailed operating principle of the minimum VDS limiter 106 will be described below with respect to FIG. 2.

Figure 2:
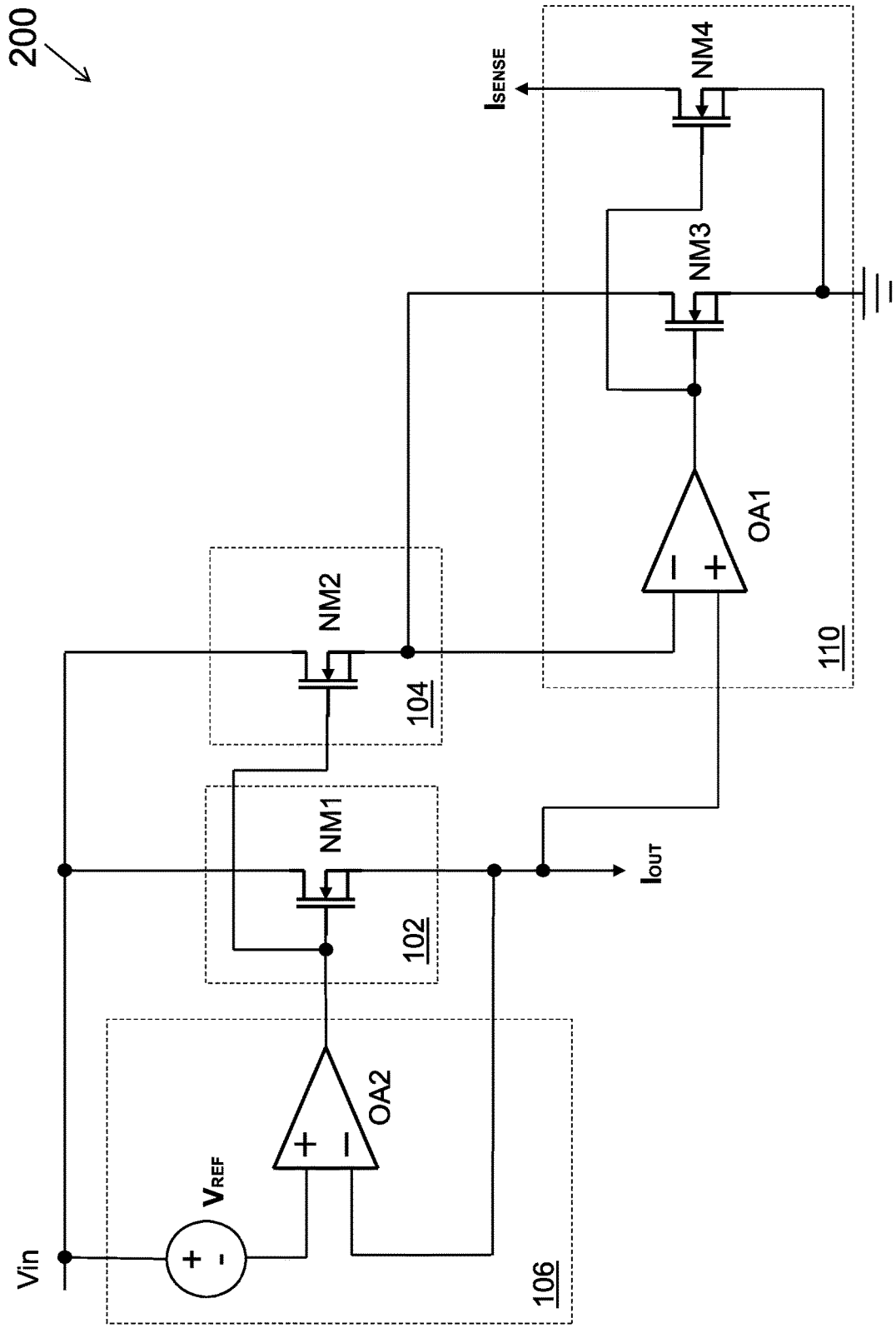
FIG. 2 illustrates a schematic diagram of a first implementation of the battery charger system shown in FIG. 1 in accordance with various embodiments of the present disclosure.

The current sense processor 110 comprises an operational amplifier (illustrated in FIG. 2). As shown in FIG. 1, the current sense processor 110 is connected to both the main switch 102 and the sense switch 104. The operational amplifier of the current sense processor 110 is employed to maintain the drain-to-source voltage of the main switch 102 equal to the drain-to-source voltage of the sense switch 104 so that the main switch 102 and the sense switch 104 form a current mirror.

The main switch 102 may comprise M transistor cells connected in parallel. The sense switch 104 may comprise m transistor cells connected in parallel. In some embodiments, M is greater than m. As a result, the current mirror may scale down the current flowing through the main switch 102 by a ratio of M to m. The detailed operation of the current sense processor 110 will be described below with respect to FIG. 2.

FIG. 2 illustrates a schematic diagram of a first implementation of the battery charger system shown in FIG. 1 in accordance with various embodiments of the present disclosure. The battery charger system 200 comprises a first n-type metal oxide semiconductor (NMOS) transistor NM1 (102), a second NMOS transistor NM2 (104), a third NMOS transistor NM3, a fourth NMOS transistor NM4, a first operational amplifier OA1, a second operational amplifier OA2 and a reference voltage source $V_{REF}$. As shown in FIG. 2, the drain of the first NMOS transistor NM1 is connected to the power source Vin. A current flowing through the first NMOS transistor NM1 is delivered to a load. In some embodiments, the current delivered to the load is used to charge a battery.

The second NMOS transistor NM2 has a gate connected to the gate of the first NMOS transistor NM1. The drain of the second NMOS transistor NM2 is connected to the drain of the first NMOS transistor NM1 and further connected to the power source Vin. The source of the first NMOS transistor NM1 and the source of the second NMOS transistor NM2 are connected to a non-inverting input and an inverting input of the first operational amplifier OA1 respectively.

The first operational amplifier OA1 drives the voltage difference across its two inputs equal to zero or almost equal to zero. More particularly, when uneven voltages at the two inputs of the first operational amplifier OA1 occur, the first operational amplifier OA1 may adjust the voltage across the second NMOS transistor NM2 by adjusting the voltage at the gate of the third NMOS transistor NM3. As a result, the voltage across the second NMOS transistor NM2 is forced to be equal to that of the voltage across the first NMOS transistor NM1.

Since the drain-to-source voltage of the first NMOS transistor NM1 is equal to the drain-to-source voltage of the second NMOS transistor NM2 and the gate of the first NMOS transistor NM1 is connected to the gate of the second NMOS transistor NM2, the first NMOS transistor NM1 and the second NMOS transistor NM2 form a first current mirror. According to the operating principles of current mirrors, the current flowing through the second NMOS transistor NM2 is proportional to the current flowing through the first NMOS transistor NM1.

In some embodiments, the first current mirror formed by NM1 and NM2 is used to scale down the current flowing through the first NMOS transistor NM1 to a lower level so that the power loss at the sensing device can be reduced accordingly. In some embodiments, the first NMOS transistor NM1 may comprise M transistor cells connected in parallel. The second NMOS transistor NM2 may comprise m transistor cells connected in parallel. The first current mirror may scale down the current flowing through the first NMOS transistor NM1 by a ratio of M to m. In some embodiments, M is equal 100,000 and m is equal to 1. It should be noted that the ratio of 100,000 to 1 is merely an example. This ratio is selected purely for demonstration purposes and is not intended to limit the various embodiments of the present disclosure.

In alternative embodiments, the first NMOS transistor NM1 may be an NMOS transistor having a channel width equal to M. The second NMOS transistor NM2 is an NMOS transistor having a channel width equal to m. It is well known that when two transistors have the same drain, source and gate voltages, the current flowing through each transistor is proportional to its channel width. As shown in FIG. 2, the drains, sources and gates of the first NMOS transistor NM1 and the second NMOS transistor NM2 are at the same voltage potentials. As a result, the current mirror formed by the first NMOS transistor NM1 and the second NMOS transistor NM2 has a ratio of M to m.

The third NMOS transistor NM3 and the fourth NMOS transistor NM4 form a second current mirror. The current flowing through the third NMOS transistor NM3 is equal to the current flowing through the second NMOS transistor NM2 (less any current flowing through the inverting input of the first operational amplifier OA1 which, given the high input impedance of an operational amplifier, is negligible and can be disregarded). The current flowing through the fourth NMOS transistor NM4 is proportional to the current flowing through the third NMOS transistor NM3. The current level of $I_{SENSE}$ may be determined by selecting the ratio of the second current mirror. In some embodiments, the size of the third NMOS transistor NM3 is equal to the size of the fourth NMOS transistor NM4. In other words, the ratio of the second current mirror is set to 1. It should be noted that the ratio of the second current mirror is selected purely for demonstration purposes and is not intended to limit the various embodiments of the present disclosure.

The minimum VDS limiter 106 comprises a second operational amplifier OA2 and a reference voltage source $V_{REF}$. The output of the second operational amplifier OA2 is connected to the gates of the first NMOS transistor NM1 and the second NMOS transistor NM2. The inverting input of the second operational amplifier OA2 is connected to the source of the first NMOS transistor NM1. The reference voltage source $V_{REF}$ is connected between the power source Vin and the non-inverting input of the second operational amplifier OA2.

In operation, when the current flowing through the NMOS NM1 is high, the drain-to-source voltage of the NMOS transistor NM1 is greater than the reference voltage $V_{REF}$. As a result, the voltage at the non-inverting input of the second operational amplifier OA2 is greater than the voltage at the inverting input of the second operational amplifier OA2. The output of the second operational amplifier OA2 is pulled up to a high voltage (e.g., the bias voltage of the second operational amplifier OA2). Such a high voltage turns the first NMOS transistor NM1 fully on. The voltage across the first NMOS transistor NM1 is equal to the current flowing through the first NMOS transistor NM1 times the on-resistance of the first NMOS transistor NM1.

On the other hand, when the current flowing through the first NMOS transistor NM1 times the on-resistance of the first NMOS transistor NM1 is less than the reference voltage $V_{REF}$, the second operational amplifier OA2 forces the voltage across the first NMOS transistor NM1 equal to the reference voltage $V_{REF}$ by reducing the gate voltage of the NMOS transistor NM1. In particular, since the reference voltage $V_{REF}$ is connected between the power source Vin and the non-inverting input of the second operational amplifier OA2, the second operational amplifier OA2 may adjust the voltage across the first NMOS transistor NM1 to offset the impact from the reference voltage so as to make the voltage difference across the inputs of the second operational amplifier OA2 equal to zero or almost equal to zero.

In some embodiments, the output voltage of the reference voltage source is equal to 50 mV. In order to make the voltage difference across the inputs of the second operational amplifier OA2 equal to zero, the drain-to-source voltage of the first NMOS transistor NM1 is forced to be equal to 50 mV. In other words, the reference voltage source injects a minimum voltage (e.g., 50 mV) into the voltage across the first NMOS transistor NM1 when the current flowing through the first NMOS transistor NM1 times the on-resistance of the first NMOS transistor NM1 is less than the reference voltage $V_{REF}$.

One advantageous feature of having the minimum VDS limiter 106 is that the minimum voltage across the first NMOS transistor NM1 helps to improve the measurement accuracy when the current flowing through the first NMOS transistor NM1 is relatively low. For example, the on-resistance of the first NMOS transistor NM1 is equal to 25 mΩ. When the current flowing through the first NMOS transistor NM1 is equal to 5 A, the voltage across the first NMOS transistor NM1 is equal to 125 mV. The offset voltage of the first operational amplifier OA1 is about 5 mV. The impact of the offset voltage can be ignored because the offset voltage is about 4% of the voltage across the first NMOS transistor NM1. On the other hand, when the current flowing through the first NMOS transistor NM1 is equal to 25 mA, the voltage across the first NMOS transistor NM1 is equal to 0.625 mV. Under this operation condition, the offset voltage (e.g., 5 mV) is greater than the voltage across the first NMOS transistor NM1. The offset voltage will cause an inaccurate measurement result. By employing the minimum VDS limiter 106, the drain-to-source voltage of the first NMOS transistor NM1 is increased to a level suitable for overcoming the impact of the offset voltage. For example, when minimum drain-to-source voltage is set to 50 mV, the offset voltage is only about 10% of the voltage across the first NMOS transistor NM1.

Figure 3:
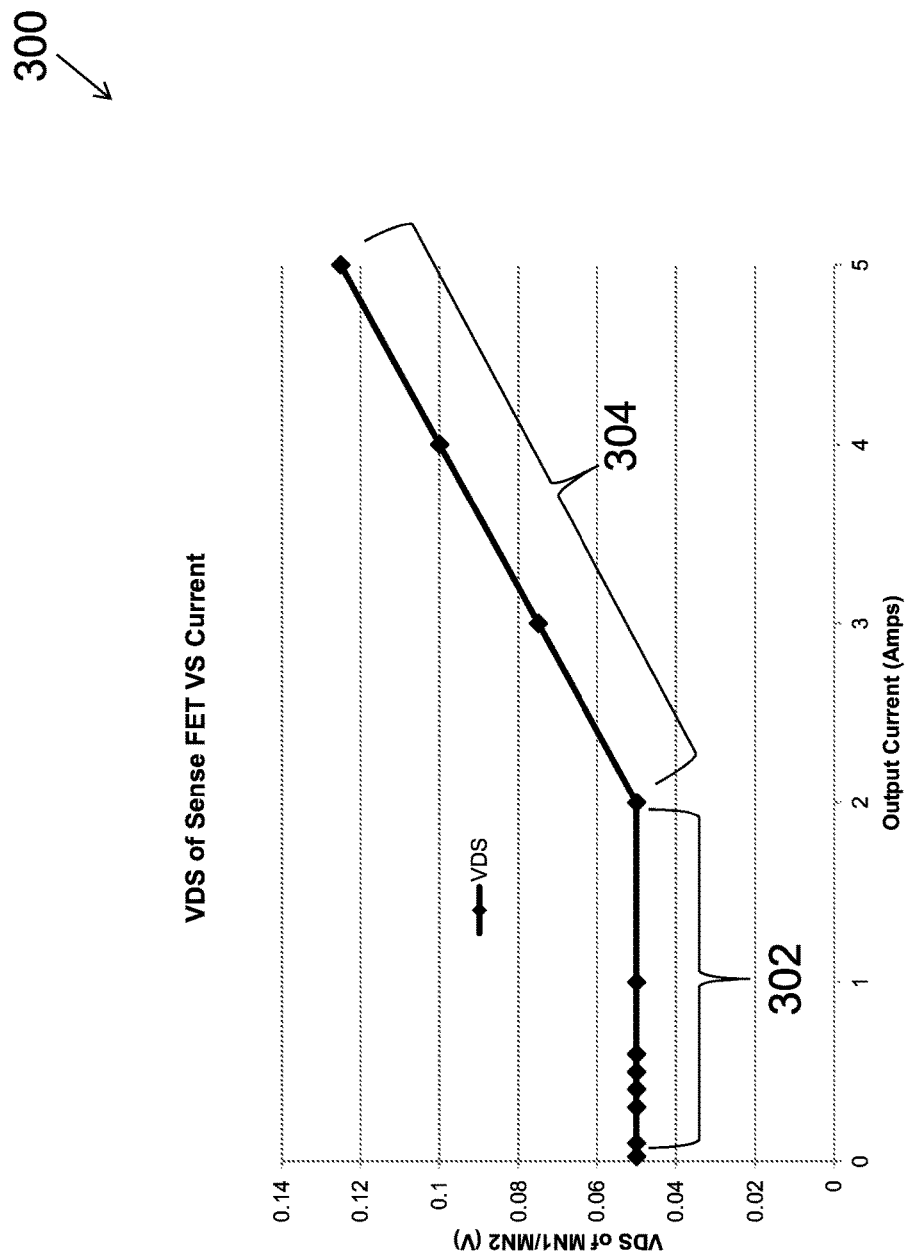
FIG. 3 is a current-voltage curve illustrating the operating principle of the battery charger system shown in FIG. 2 in accordance with various embodiments of the present disclosure.

FIG. 3 is a current-voltage curve illustrating the operating principle of the battery charger system shown in FIG. 2 in accordance with various embodiments of the present disclosure. The horizontal axis of FIG. 3 represents the current flowing through the first NMOS transistor NM1. The unit of the horizontal axis is Ampere. The vertical axis represents the drain-to-source voltage of the first NMOS transistor NM1.

As shown in FIG. 3, the curve 300 includes two portions, namely a straight line portion 302 and a slope portion 304. When the current flowing through the first NMOS transistor NM1 is greater than about 2 A, the drain-to-source voltage of the first NMOS transistor NM1 is proportional to the current flowing through the first NMOS transistor NM1. When the current flowing through the first NMOS transistor NM1 is less than 2 A, the drain-to-source voltage of the first NMOS transistor NM1 is maintained at a level approximately equal to 50 mV by the minimum VDS limiter 106.

It should be noted that the curve shown in FIG. 3 is merely an example, which should not unduly limit the scope of the claims. One of ordinary skill in the art would recognize many variations, alternatives, and modifications. For example, the voltage level of the straight line portion may vary by adjusting the output voltage of the reference voltage source.

Figure 4:
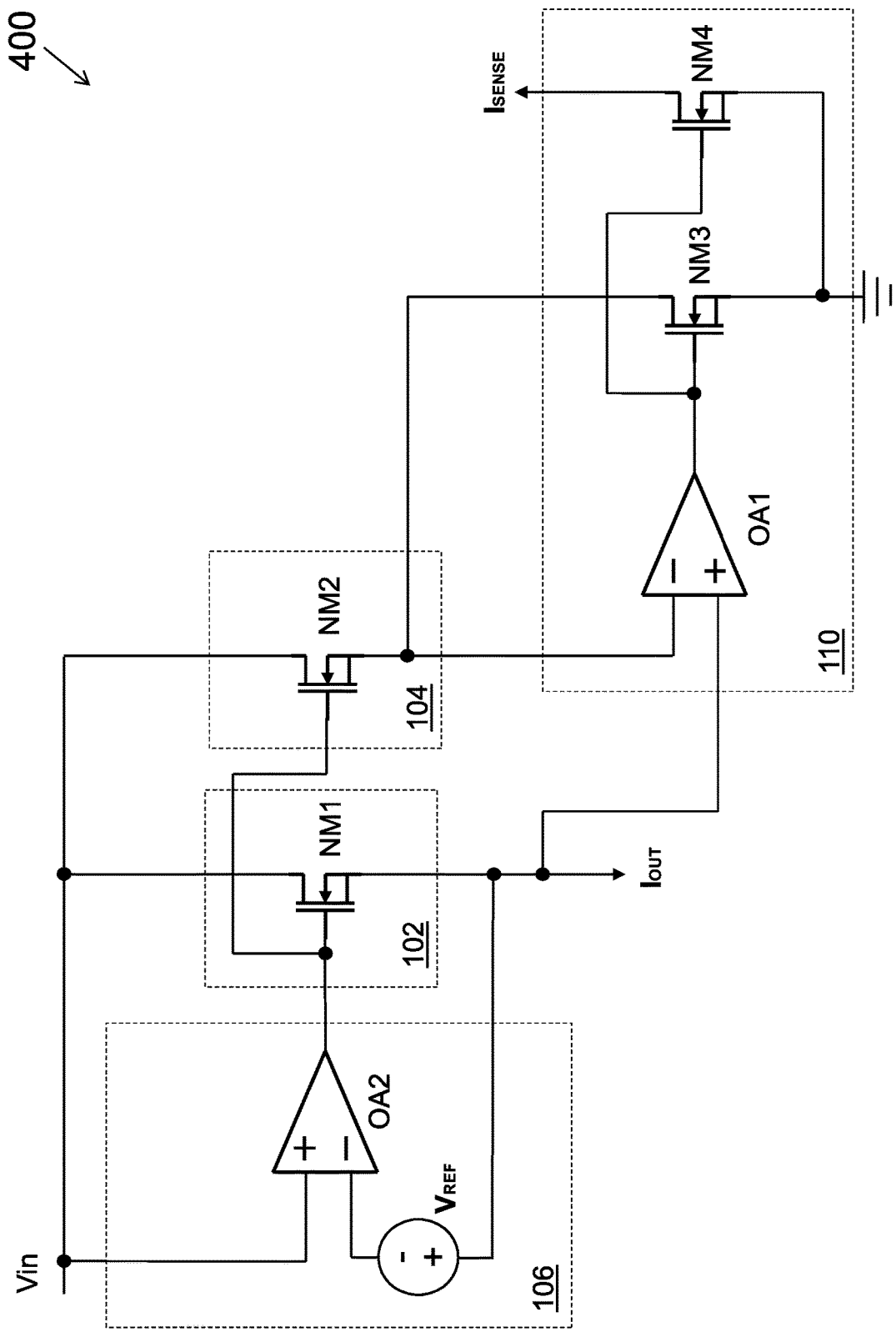
FIG. 4 illustrates a schematic diagram of a second implementation of the battery charger system shown in FIG. 1 in accordance with various embodiments of the present disclosure.

FIG. 4 illustrates a schematic diagram of a second implementation of the battery charger system shown in FIG. 1 in accordance with various embodiments of the present disclosure. The structure of the battery charger system 400 is similar to that shown in FIG. 2 except that the location of the reference voltage source is different. More particularly, the non-inverting input of the second operational amplifier OA2 is connected to the power source Vin. The reference voltage source $V_{REF}$ is connected between the source of the first NMOS transistor NM1 and the inverting input of the second operational amplifier OA2. In particular, the positive terminal of the reference voltage source $V_{REF}$ is connected to the source of the first NMOS transistor NM1. The negative terminal of the reference voltage source $V_{REF}$ is connected to the inverting input of the second operational amplifier OA2. The operating principle of the minimum VDS limiter 106 shown in FIG. 4 is similar to that shown in FIG. 2, and hence is not discussed again to avoid repetition.

Figure 5:
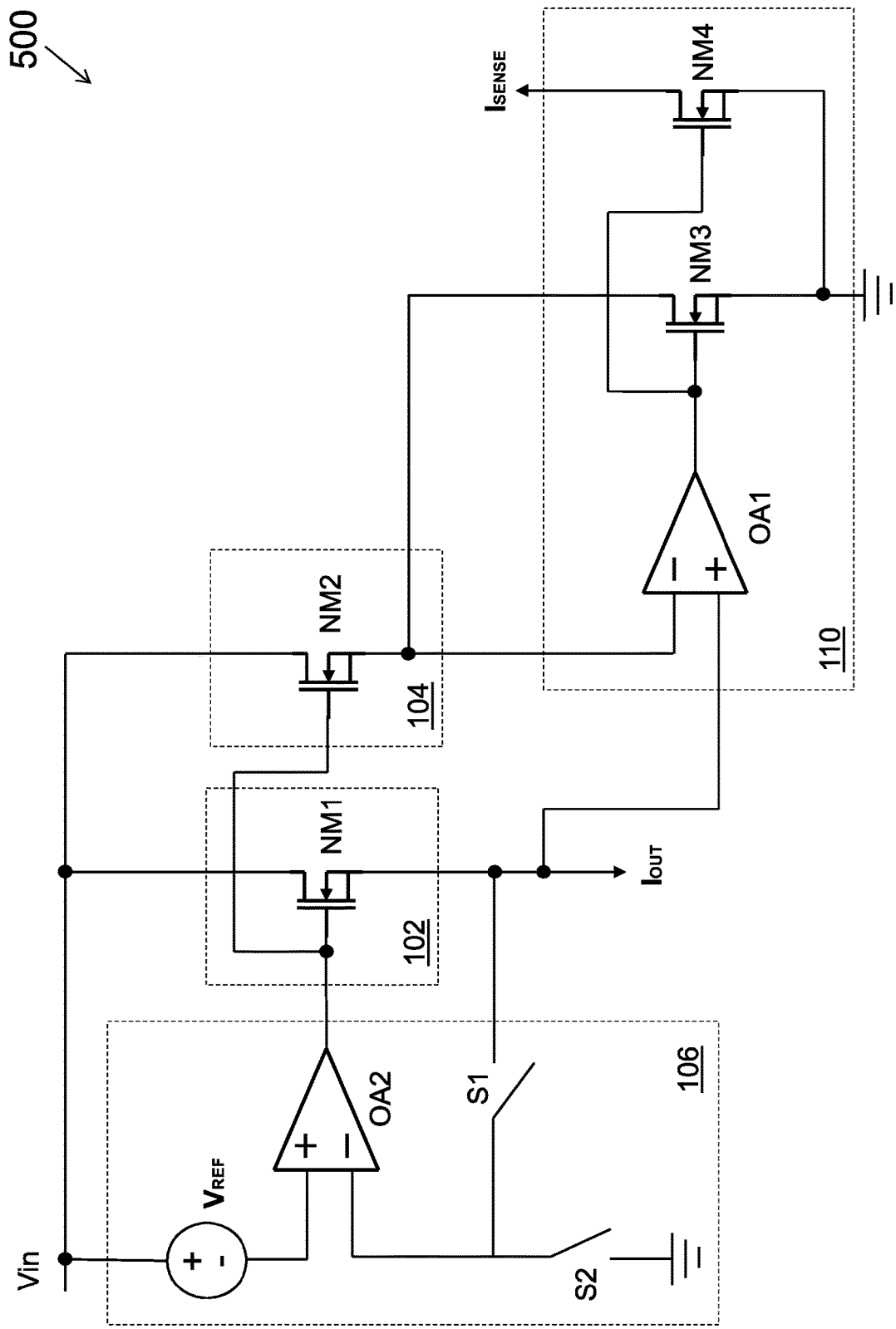
FIG. 5 illustrates a schematic diagram of a third implementation of the battery charger system shown in FIG. 1 in accordance with various embodiments of the present disclosure.

FIG. 5 illustrates a schematic diagram of a third implementation of the battery charger system shown in FIG. 1 in accordance with various embodiments of the present disclosure. The structure of the battery charger system 500 is similar to that shown in FIG. 2 except that two additional switches have been included to further improve the performance of the battery charger system.

As shown in FIG. 5, a first switch S1 is connected between the source of the first NMOS transistor NM1 and the inverting input of the second operational amplifier OA2. A second switch S2 is connected between the inverting input of the second operational amplifier OA2 and ground. The first switch S1 and the second switch S2 may be NMOS transistors or PMOS transistors. In some embodiments, the first switch S1 and the second switch S2 are configured to be controlled by complementary drive signals.

The battery charger system 500 may include a current sense mode and a power saving mode. When the battery charger system 500 operates in the current sense mode, the first switch S1 is turned on and the second switch S2 is turned off. In other words, the system configuration of the battery charger system 500 under the current sense mode is the same as that shown in FIG. 2. When battery charger system 500 operates in the power saving mode, the first switch S1 is turned off and the second switch S2 is turned on. The voltage at the non-inverting input of the second operational amplifier OA2 is greater than the voltage at the inverting input of the second operational amplifier OA2. As a result, the minimum VDS limiter 106 has no impact on the operation of the battery charger system 500.

The power loss of the battery charger system 500 is proportional to the voltage across the first NMOS transistor NM1. One advantageous feature of having the power saving mode is that the efficiency of the battery charger system 500 is improved by disabling the minimum VDS limiter 106 when the battery charger system 500 is not operating in the current sense mode.

Figure 6:
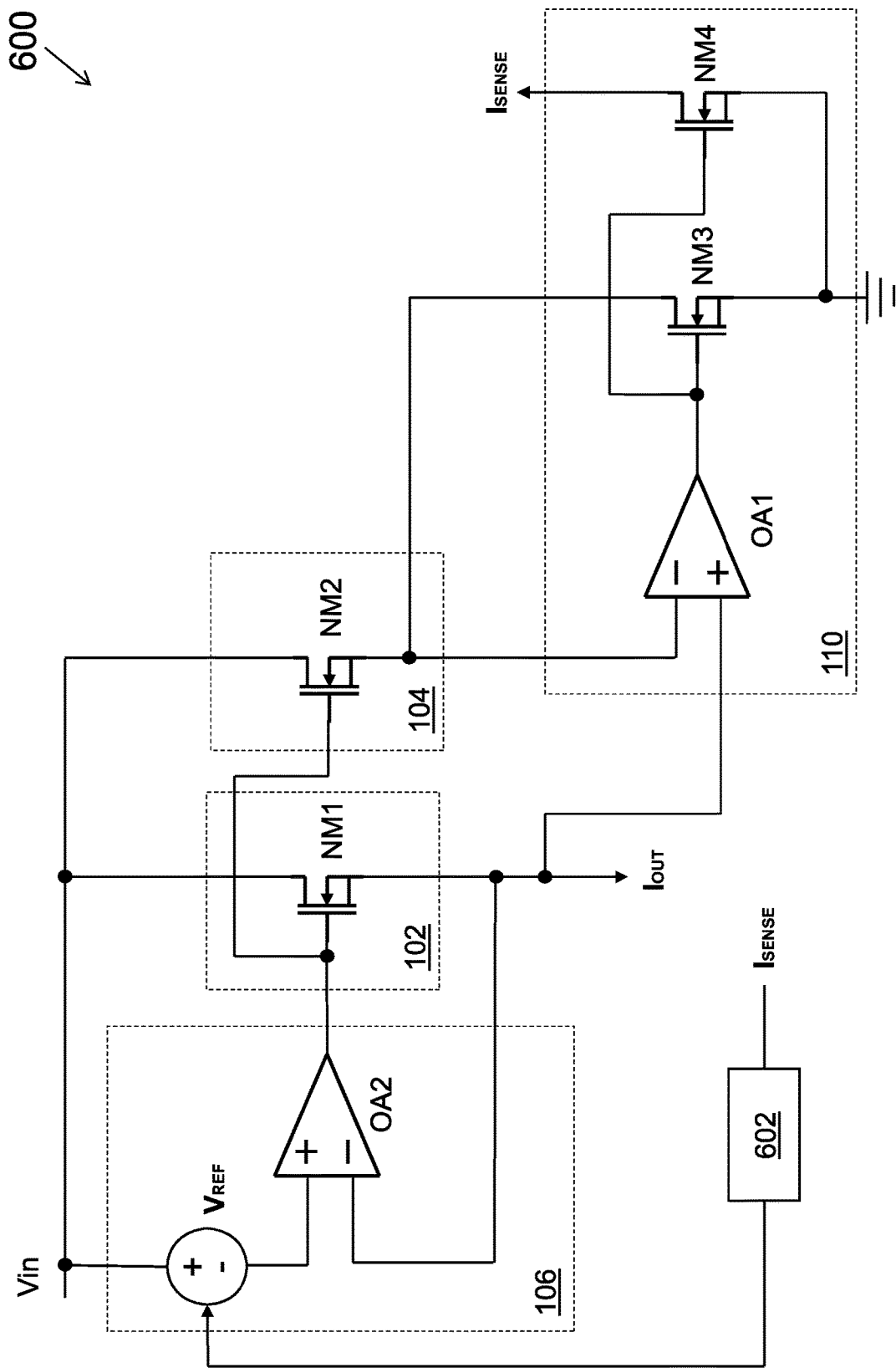
FIG. 6 illustrates a schematic diagram of a fourth implementation of the battery charger system shown in FIG. 1 in accordance with various embodiments of the present disclosure.

FIG. 6 illustrates a schematic diagram of a fourth implementation of the battery charger system shown in FIG. 1 in accordance with various embodiments of the present disclosure. The structure of the battery charger system 600 is similar to that shown in FIG. 2 except that the reference voltage source can be dynamically adjusted based upon the sensed current. More particularly, the output voltage of the reference voltage source is not fixed. Instead, the output voltage of the reference voltage source is adjustable based upon the operating conditions of the battery charger system 600. A controller 602 is included as shown in FIG. 6. The controller 602 may adjust the output voltage of the reference voltage source based upon the sensed current generated by the fourth NMOS transistor NM4.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
in a current sense mode, applying a minimum drain-to-source voltage limiter to a first current mirror of a current sense apparatus, wherein, as a result of applying the minimum drain-to-source voltage limiter to the first current mirror, a voltage across the first current mirror is clamped to a predetermined value; and
in a power saving mode, disabling the minimum drain-to-source voltage limiter;
wherein the current sense apparatus comprises:
the first current mirror comprising a first switch coupled between a power source and a load, and a second switch comprising a gate connected to a gate of the first switch;
a first operational amplifier having a first input connected to the first switch and a second input connected to the second switch; and
a second operational amplifier having an output connected to the gate of the first switch, a first input coupled to a first drain/source terminal of the first switch and a second input coupled to a second drain/source terminal of the first switch.

2. The method of claim 1, wherein the current sense apparatus further comprises:
a reference voltage source connected to one input of the second operational amplifier.

3. The method of claim 2, wherein the current sense apparatus further comprises:
a second current mirror comprising a third switch and a fourth switch, wherein a gate of the third switch is connected to a gate of the fourth switch and further connected to an output of the first operational amplifier.

4. The method of claim 2, further comprising:
dynamically adjusting an output voltage of the reference voltage source based upon a sensed current generated by the current sense apparatus.

5. The method of claim 2, further comprising:
in the current sense mode, injecting a minimum voltage into a voltage across the first switch so that the voltage across the first switch is substantially equal to an output voltage of the reference voltage source.

6. The method of claim 5, wherein:
the reference voltage source is connected between the first drain/source terminal of the first switch and a non-inverting input of the second operational amplifier.

7. The method of claim 6, wherein:
a fifth switch is connected between an inverting input of the second operational amplifier and the second drain/source terminal of the first switch;
a sixth switch is connected between the inverting input of the second operational amplifier and ground;
the current sense apparatus operates in the current sense mode when the fifth switch is turned on and the sixth switch is turned off; and
the current sense apparatus operates in the power saving mode when the fifth switch is turned off and the sixth switch is turned on.

8. A method comprising:
generating a voltage across a first current mirror of a current sense apparatus, the voltage being proportional to a current flowing through the current sense apparatus when the current is greater than a predetermined current value; and
applying a minimum drain-to-source voltage limiter to the first current mirror of the current sense apparatus when the current is less than the predetermined current value, wherein, as a result of applying the minimum drain-to-source voltage limiter to the first current mirror, the voltage across the first current mirror is clamped to a predetermined voltage value;
wherein the current sense apparatus comprises:
the first current mirror comprising a first switch and a second switch, wherein a gate of the first switch is connected to a gate of the second switch;
a first operational amplifier having a first input connected to the first switch and a second input connected to the second switch; and
a second operational amplifier having an output connected to the gate of the first switch, a non-inverting input connected to a first drain/source terminal of the first switch and an inverting input connected to a second drain/source terminal of the first switch.

9. The method of claim 8, wherein the current sense apparatus further comprises:
a second current mirror comprising a third switch and a fourth switch, wherein a gate of the third switch is connected to a gate of the fourth switch;
wherein the non-inverting input of the second operational amplifier is connected to the first drain/source terminal of the first switch through a reference voltage source.

10. The method of claim 9, wherein:
a voltage across the fourth switch is proportional to a current flowing through the first switch when the current flowing through the first switch is greater than the predetermined current value.

11. The method of claim 9, wherein:
the first operational amplifier is configured such that a drain-to-source voltage of the first switch is substantially equal to a drain-to-source voltage of the second switch.

12. The method of claim 9, wherein:
a drain of the third switch is connected to a source of the second switch; and
a source of the third switch is connected to ground, and wherein the first operational amplifier adjusts a drain-to-source voltage of the second switch through adjusting a gate voltage of the third switch.

13. The method of claim 9, wherein:
an output voltage of the reference voltage source is approximately equal to 50 mV.

14. The method of claim 9, wherein:
the voltage across the first current mirror is clamped to a predetermined voltage through reducing a gate voltage of the first switch.

15. The method of claim 8, further comprising:
configuring the current sense apparatus to operate in a power saving mode by disabling the minimum drain-to-source voltage limiter.

16. A method comprising:
passing a current from a power source to a load through a first switch;
mirroring in a second switch the current passing through the first switch, wherein the second switch comprises a gate connected to a gate of the first switch and a first terminal connected to a first terminal of the first switch;
driving a voltage at a second terminal of the first switch equal to a voltage at a second terminal of the second switch through a first operational amplifier;
maintaining a minimum voltage across the first switch through a second operational amplifier having an output connected to the gate of the first switch, a first input coupled to the first terminal of the first switch and a second input coupled to the second terminal of the first switch;

enabling a reference voltage source connected to one input of the second operational amplifier so that a voltage across the first switch is approximately equal to an output voltage of the reference voltage source during a current sense operation; and disabling the reference voltage source so that the voltage across the first switch is equal to the current flowing through the first switch times an on-resistance value of the first switch during a power saving operation.

17. The method of claim 16, further comprising:
dynamically adjusting the output voltage of the reference voltage source based upon the current flowing through the first switch.

18. The method of claim 16, further comprising:
coupling a third switch between the second terminal of the first switch and the second input of the second operational amplifier; and
coupling a fourth switch between the second input of the second operational amplifier and ground.

19. The method of claim 18, further comprising:
in response to the current sense operation, turning on the third switch and turning off the fourth switch; and
in response to the power saving operation, turning on the fourth switch and turning off the third switch.

20. The method of claim 18, wherein:
the reference voltage source is connected to the first input of the second operational amplifier.

* * * * *